(12) United States Patent
Jung et al.

(10) Patent No.: US 10,211,514 B2
(45) Date of Patent: Feb. 19, 2019

(54) ANTENNA USING CONDUCTOR AND ELECTRONIC DEVICE THEREFOR

(71) Applicant: Samsung Electronics Co., Ltd., Gyeonggi-do (KR)

(72) Inventors: Chung Hyo Jung, Gyeonggi-do (KR); Bong Jae Rhee, Gyeonggi-do (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 252 days.

(21) Appl. No.: 14/714,702

(22) Filed: May 18, 2015

(65) Prior Publication Data
US 2015/0349406 A1    Dec. 3, 2015

(30) Foreign Application Priority Data

May 28, 2014  (KR) .................. 10-2014-0064267

(51) Int. Cl.
| | | |
|---|---|---|
| *H01Q 1/24* | (2006.01) | |
| *H01Q 7/00* | (2006.01) | |
| *H05K 7/20* | (2006.01) | |

(52) U.S. Cl.
CPC .............. *H01Q 1/243* (2013.01); *H01Q 7/00* (2013.01); *H05K 7/2039* (2013.01)

(58) Field of Classification Search
CPC ......... H01Q 1/243; H01Q 7/00; H05K 7/2039
See application file for complete search history.

(56) References Cited

U.S. PATENT DOCUMENTS

| | | | |
|---|---|---|---|
| 8,319,298 B2 | 11/2012 | Hsu | |
| 9,647,327 B2 | 5/2017 | Schindler et al. | |
| 2011/0127665 A1 | 6/2011 | Hsu | |
| 2012/0032858 A1 | 2/2012 | Chang et al. | |
| 2012/0268335 A1 | 10/2012 | Zhang et al. | |
| 2013/0154885 A1* | 6/2013 | Schindler ............. | G06K 19/077 343/700 MS |
| 2014/0078679 A1* | 3/2014 | Tsunoda ................. | G06F 1/203 361/720 |

(Continued)

FOREIGN PATENT DOCUMENTS

| | | |
|---|---|---|
| CN | 201629397 U | 11/2010 |
| CN | 102427159 A | 4/2012 |
| CN | 102751567 A | 10/2012 |

(Continued)

OTHER PUBLICATIONS

Chinese Search Report dated Aug. 23, 2018.

*Primary Examiner* — Jessica Han
*Assistant Examiner* — Amal Patel
(74) *Attorney, Agent, or Firm* — Cha & Reiter, LLC

(57) ABSTRACT

An electronic device includes a first region corresponding to a first part of the electronic device, and a second region corresponding to a second part of the electronic device. The second region has a lower temperature than that of the first region. An antenna is located over at least the first region and optionally the second region of the electronic device. A conductor is arranged over at least the first region of the electronic device to transmit heat from the first region to the second region. The conductor operates in conjunction with the antenna and is adjacent to at least a part of the antenna to prevent the conductor from interfering with the antenna.

13 Claims, 12 Drawing Sheets

(56) References Cited

U.S. PATENT DOCUMENTS

2014/0292608 A1* 10/2014 Hamabe .................. H01Q 1/48
343/848
2016/0255184 A1* 9/2016 Hwang ................ H04B 5/0031
455/41.1

FOREIGN PATENT DOCUMENTS

| CN | 102800923 A | | 11/2012 |
|---|---|---|---|
| CN | 103004293 A | | 3/2013 |
| KR | 20110090698 A | * | 8/2011 |
| KR | 10-2012-0013838 A | | 2/2012 |

\* cited by examiner

| LAYER CLASSIFICATION | LDS NON-PLATING CASE | LDS PLATING CASE |
|---|---|---|
| PROTECTIVE PAINTING LAYER | 35~40 μm | |
| LDS PLATING LAYER | --- | 25~30 μm |
| LDS COATING LAYER | 20~25 μm | 10~15 μm |
| TOTAL THICKNESS | 55~65 μm | 70~85 μm |

FIG. 5B

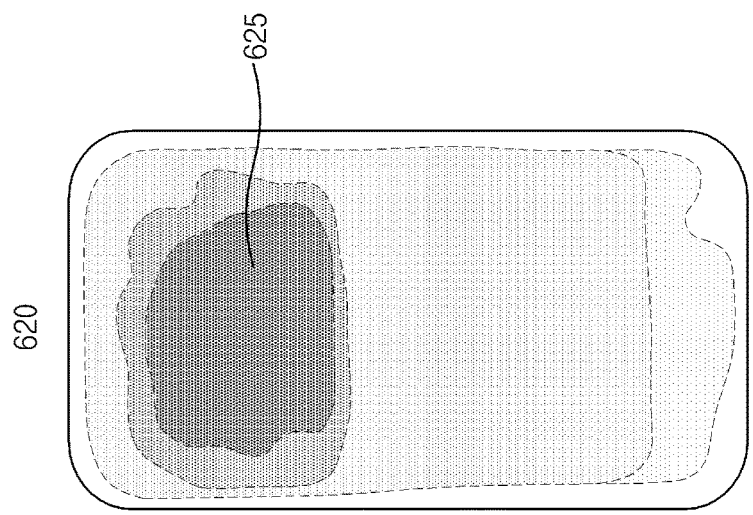
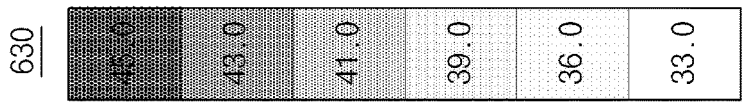
FIG. 6
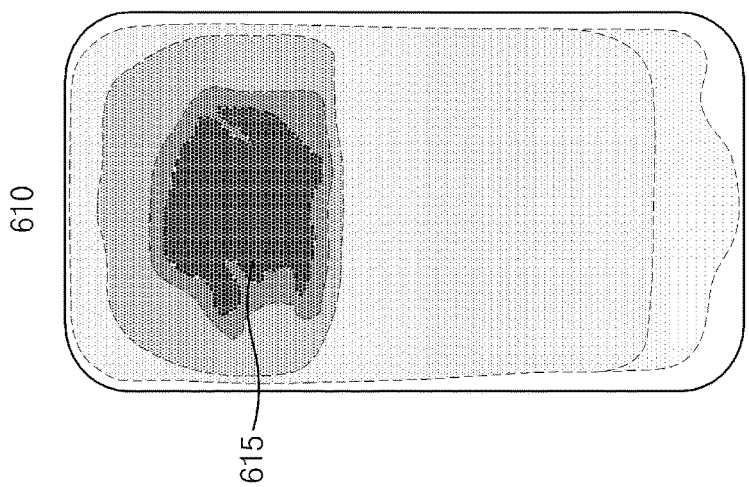

ANTENNA USING CONDUCTOR AND ELECTRONIC DEVICE THEREFOR

CLAIM OF PRIORITY

This application claims the benefit of priority under 35 U.S.C. § 119(a) from a Korean patent application filed on May 28, 2014 in the Korean Intellectual Property Office and assigned Serial number 10-2014-0064267, the entire disclosure of which is hereby incorporated by reference in its entirety.

BACKGROUND

Field of the Disclosure

The present disclosure relates to an electronic device, and an antenna and a conductor which are included in the electronic device.

Description of the Related Art

Recently, as information communication technology has been developed, network devices, such as base stations, have been installed in all parts of the country. Electronic devices transmit and receive data with other electronic devices through networks via base stations, thereby making it possible for users to freely use the networks everywhere in the country.

The electronic devices include a circuit board having a plurality of electronic components, processors, external sockets, antennas, and the like are mounted within. The plurality of electronic components may exchange electric signals with each other and may perform a variety of operations.

Recently, as the electronic devices have become high-performance and miniaturized, the plurality of components have been mounted in a housing of each of the miniaturized electronic devices in the direction of reducing its empty space as much as possible. Accordingly, the recent direction of reducing its empty space causes a thermal problem in the electronic devices.

SUMMARY

Aspects of the present disclosure address at least some of the above-mentioned problems and/or disadvantages and to provide at least the advantages described below. Accordingly, an aspect of the present disclosure is to provide an electronic device which includes a conductor for transmitting (i.e. transferring) heat from a region which has a high temperature relatively to a region which has a low temperature relatively and an antenna for performing communication.

In accordance with an aspect of the present disclosure, an electronic device is provided. The electronic device may include a first region corresponding to at least a part of the electronic device, a second region which has a lower temperature than that of the first region, an antenna configured to be located over the first region and the second region, and a conductor configured to transmit heat of the first region to the second region, wherein the conductor operates as at least a part of the antenna and is adjacent to the antenna.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will become more apparent to a person of ordinary skill in the art from the following description taken in conjunction with the accompanying drawings, in which:

FIG. 5B is a drawing illustrating a table with exemplary thicknesses for at least partial cross sections of a back housing according to various embodiments of the present disclosure;

FIG. 6 is a drawing illustrating thermographic images in which a rear surface of an electronic device is captured according to kinds of paints used for LDS coating according to various embodiments of the present disclosure;

Throughout the drawings, it should be noted that like reference numbers are used to depict the same or similar elements, features, and structures.

DETAILED DESCRIPTION

Figure 1:
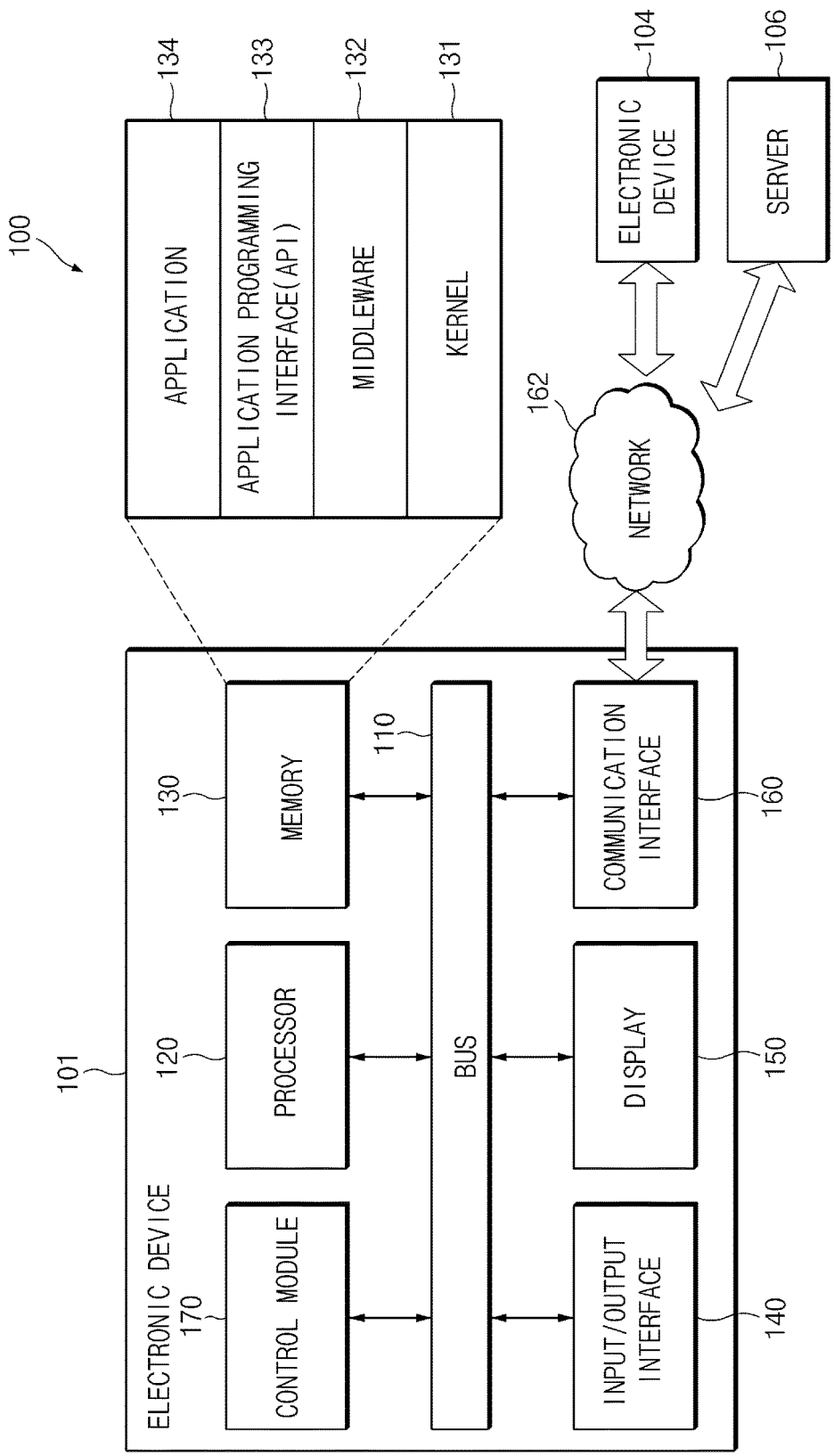
FIG. 1 is a block diagram illustrating a network environment including an electronic device according to various embodiments of the present disclosure.

Hereinafter, the present disclosure is described with reference to the accompanying drawings. Various modifications are possible in various embodiments of the present disclosure and embodiments are illustrated in drawings and related detailed descriptions are listed. However, the present disclosure is not limited to the specific embodiments shown and described herein, and it is understood the disclosure includes any or all modifications and/or, equivalents and substitutes within the scope and technical range of the present disclosure. With respect to the descriptions of the drawings, like reference numerals refer to like elements.

The term "include," "comprise," "including," or "comprising" used herein indicates disclosed functions, operations, or existence of elements but does not exclude other functions, operations or elements. It should be further understood that the term "include", "comprise", "have", "including", "comprising", or "having" used herein specifies the presence of stated features, integers, operations, elements, components, or combinations thereof but does not preclude the presence or addition of one or more other features, integers, operations, elements, components, or combinations thereof.

The meaning of the terms "or" or "at least one of A and/or B" used herein includes any combination of words listed together with the term. For example, the expression "A or B" or "at least one of A and/or B" may indicate A, B, or both A and B.

The meaning of terms, such as "first", "second", and the like used herein may refer to various elements of various embodiments of the present disclosure, but do not limit the elements. For example, such terms do not limit the order and/or priority of the elements. Furthermore, such terms may be used to distinguish one element from another element. For example, a first electronic device and a second electronic device indicate different user devices. For example, without departing the scope of the present disclosure, a first element may be referred to as a second element, and similarly, a second element may be referred to as a first element.

In the description below, when one part (or element, device, etc.) is referred to as being "connected" to another part (or element, device, etc.), it should be understood that the former can be "directly connected" to the latter, or "electrically connected" to the latter via an intervening part (or element, device, etc.). It will be further understood that when one component is referred to as being "directly connected" or "directly linked" to another component, it means that no intervening component is present.

Terms used in this specification are used to describe embodiments of the present disclosure and are not intended to limit the scope of the present disclosure. The terms of a singular form may include plural forms unless otherwise specified.

Unless otherwise defined herein, all the terms used herein, which include technical or scientific terms, have the same meaning that is generally understood by a person of ordinary skill in the art. It will be further understood that terms, which are defined in a dictionary and commonly used, should also be interpreted as is customary in the relevant related art and not in an idealized or overly formal sense unless expressly so defined herein in various embodiments of the present disclosure.

Electronic devices according to various embodiments of the present disclosure may include a conductor and an antenna. For example, the electronic devices may include at least one of smartphones, smartpads, tablet personal computers (PCs), mobile phones, video telephones, electronic book readers, desktop PCs, laptop PCs, netbook computers, personal digital assistants (PDAs), portable multimedia players (PMPs), Motion Picture Experts Group (MPEG-1 or MPEG-2) Audio Layer 3 (MP3) players, mobile medical devices, cameras, wearable devices (e.g., head-mounted-devices (HMDs), such as electronic glasses), an electronic apparel, electronic bracelets, electronic necklaces, electronic "appcessories", electronic tattoos, smart watches, and the like.

According to various embodiments of the present disclosure, the electronic devices may be smart home appliances including the conductor and the antenna. The smart home appliances may include at least one of, for example, televisions (TVs), digital versatile disc (DVD) players, audios, refrigerators, air conditioners, cleaners, ovens, microwave ovens, washing machines, air cleaners, set-top boxes, TV boxes (e.g., Samsung HomeSync™, Apple TV™, or Google TV™), game consoles, electronic dictionaries, electronic keys, camcorders, electronic picture frames, and the like, just to name a few non-limiting possibilities.

According to various embodiments of the present disclosure, the electronic devices may include at least one of medical devices (e.g., a magnetic resonance angiography (MRA), a magnetic resonance imaging (MRI), a computed tomography (CT), scanners, and ultrasonic devices), navigation devices, global positioning system (GPS) receivers, event data recorders (EDRs), flight data recorders (FDRs), vehicle infotainment devices, electronic equipment for vessels (e.g., navigation systems and gyrocompasses), avionics, security devices, head units for vehicles, industrial or home robots, automatic teller's machines (ATMs), and points of sales (POSs) including the conductor and the antenna.

According to various embodiments of the present disclosure, the electronic devices may include at least one of parts of furniture or buildings/structures having communication functions, electronic boards, electronic signature receiving devices, projectors, and measuring instruments (e.g., water meters, electricity meters, gas meters, and wave meters) including the conductor and the antenna. The electronic devices according to various embodiments of the present disclosure may be one or more combinations of the above-mentioned devices. Furthermore, the electronic devices according to various embodiments of the present disclosure may be flexible devices. A person of ordinary skill in the art understands that the electronic devices according to various embodiments of the present disclosure are not limited to the above-mentioned devices.

Hereinafter, electronic devices according to various embodiments of the present disclosure will be described with reference to the accompanying drawings. The term "user" used herein may refer to a person who uses an electronic device or may refer to a device (e.g., an artificial electronic device) that uses an electronic device through, for example, transmitted commands.

FIG. 1 is a block diagram illustrating a network environment including an electronic device according to various embodiments of the present disclosure. Referring to FIG. 1, an electronic device 101 may include a bus 110, a processor 120, a memory 130, an input and output interface 140, a display 150, a communication interface 160, and a control module 170.

The bus 110 may be a circuit which connects the above-mentioned components with each other and transmits communication (e.g., a control message) between the above-mentioned components.

For example, the processor 120, which is comprised of hardware such as circuits configured for operation, may receive instructions from the above-mentioned other components (e.g., the memory 130, the input and output interface 140, the display 150, the communication interface 160, or the control module 170, and the like) through the bus 110, may decode the received instructions, and may perform calculation or data processing according to the decoded instructions.

The memory 130, which is a non-transitory storage medium, may store instructions or data which are received from the processor 120 or other components of the electronic device (e.g., the input and output interface 140, the display 150, the communication interface 160, or the control module 170, and the like) or are generated by the processor 120 or the other components. The memory 130 may include programming modules, such as a kernel 131, a middleware 132, an application programming interface (API) 133, or an application 134. The above-mentioned respective programming modules may be configured with software, firmware, hardware, or at least two or more combinations thereof.

The kernel 131 may control or manage system resources (e.g., the bus 110, the processor 120, or the memory 130, and the like) used to execute an operation or function implemented in the other programming modules, for example, the middleware 132, the API 133, or the application 134. Also, the kernel 131 may provide an interface which may access a separate component of the electronic device 101 in the middleware 132, the API 133, or the application 134 and may control or manage the separate component.

The middleware 132 can provide a role as a go-between such that the API 133 or the application 134 communicates with the kernel 131 and transmits and receives data. Also, the middleware 132 may perform control (e.g., scheduling or load balancing) with respect to work requests using a method of assigning priority which may use system resources (the bus 110, the processor 120, or the memory 130, and the like) of the electronic device 101 to, for example, at least one of the application 134, in association with the work requests received from the application 134.

The API 133 may be an interface in which the application 134 controls a function provided from the kernel 131 or the middleware 132. For example, the API 133 may include at least one interface or function (e.g., instruction) for file control, window control, image processing, or text control, and the like.

According to various embodiments of the present disclosure, the applications 134 may include a short message service/multimedia message service (SMS/MMS) application, an e-mail application, a calendar application, an alarm application, a health care application (e.g., an application for measuring quantity of exercise or blood sugar, and the like), or an environment information application (e.g., an application for providing atmospheric pressure information, humidity information, or temperature information, and the like), and the like. Additionally or alternatively, the application 134 may be an application associated with exchanging information between the electronic device 101 and an external electronic device (e.g., an electronic device 104). The application associated with exchanging the information may include, for example, a notification relay application for transmitting specific information to the external electronic device or a device management application for managing the external electronic device.

With regard to the notification relay, there may be a notification relay application that includes a function of transmitting notification information, which are generated by other applications (e.g., the SMS/MMS application, the e-mail application, the health care application, or the environment information application, and the like) of the electronic device 101, to the external electronic device (e.g., the electronic device 104). Additionally or alternatively, the notification relay application may receive notification information from, for example, the external electronic device (e.g., the electronic device 104), and may provide the received notification information to a user of the electronic device 101.

Moreover, the device management application may manage (e.g., install, delete, or update) a function (e.g., a function of turning on/off the external electronic device itself (or partial components) or a function of adjusting brightness (or resolution) of the display 150) for at least a part of the external electronic device (e.g., the electronic device 104) which communicates with the electronic device 101, an application which operates in the external electronic device, or a service (e.g., a call service or a message service) provided from the external electronic device.

According to various embodiments of the present disclosure, the application 134 may include an application specified according to attributes (e.g., a kind of the electronic device) of the external electronic device (the electronic device 104). For example, the external electronic device is a motion picture experts group (MPEG-1 or MPEG-2) audio layer 3 (MP3) player, the application 134 may include an application associated with playing music. Similarly, when the external electronic device is a mobile medical device, the application 134 may include an application associated with health care. According to an embodiment of the present disclosure, the application 134 may include at least one of an application specified in the electronic device 101 and an application received from the external electronic device (e.g., a server 106 or the electronic device 104).

With continued reference to FIG. 1, the input and output interface 140 may transmit instructions or data input from the user through an input and output device (e.g., a sensor, a keyboard, or a touch screen) to, for example, the processor 120, the memory 130, the communication interface 160, or the control module 170 through the bus 110. For example, the input and output interface 140 may provide data about a touch of the user, which is input through the touch screen, to the processor 120. Also, the input and output interface 140 may output instructions or data received from, for example, the processor 120, the memory 130, the communication interface 160, or the control module 170 through the bus 110, through the input and output device (e.g., a speaker or the display 150). For example, the input and output interface 140 may output voice data processed through the processor 120 to the user through the speaker.

The display 150 may display a variety of information in various forms (e.g., multimedia data, or text data, and the like) to the user.

The communication interface 160 may perform communication between the electronic device 101 and the external electronic devices (e.g., the electronic device 104 or the server 106). For example, the communication interface 160 may connect to a network 162 through wireless communication or wire communication and may communicate with the external electronic device. The wireless communication may include at least one of, for example, wireless-fidelity (Wi-Fi) communication, Bluetooth (BT) communication, near field communication (NFC), global positioning system (GPS) communication, and cellular communication (e.g., 3 generation (3G), long term evolution (LTE), LTE-advanced (LTE-A), code division multiple access (CDMA), wideband CDMA (WCDMA), universal mobile telecommunications system (UMTS), wireless broadband (WiBro), or global system for mobile communications (GSM), and the like). The wire communication may include at least one of a universal serial bus (USB), a high definition multimedia interface (HDMI), a recommended standard 232 (RS-232), and/or a plain old telephone service (POTS).

According to an embodiment of the present disclosure, the network 162 may comprise a telecommunications network. The telecommunications network may include at least one of a computer network, the Internet, the Internet of things, and a telephone network. According to an embodiment of the present disclosure, a protocol (a transport layer protocol, a data link layer protocol, or a physical layer protocol) for communication between the electronic device 101 and the external electronic device may be supported in at least one of the application 134, the API 133, the middle ware 132, the kernel 131, and the communication interface 160.

With continued reference to FIG. 1, the control module 170 may process at least some of information obtained from other elements (e.g., the processor 120, the memory 130, the input and output interface 140, the display 150, or the communication interface 160, and the like), and may provide the processed information to the user by various methods.

For example, the control module 170, which may be referred to as a controller or control unit, comprises circuitry configured for operation that may control at least a part of functions of the electronic device 101 such that the electronic device 101 communicates using the processor 120, or communicates independently of the processor 120.

According to various embodiments of the present disclosure, the input and output interface 140 may receive a user input for requesting activation of at least one or more of communication modules included in the electronic device 101. The control module 170 may activate a corresponding communication module such that the electronic device 101 performs communication corresponding to the communication module which is requested to be activated, which may be according to a request (instruction) of the processor 120, or independently of the processor 120 based on the received user input.

According to various embodiments of the present disclosure, the communication interface 160 may receive a message requesting activation of a communication module corresponding to another network through a network session connected with the external electronic device, or by a broadcasting method from the external electronic device. The control module 170 may activate a communication module which is requested to be activated such that the electronic device 101 performs communication through another network, according to a request (or instruction) of the processor 120 or independently of the processor 120 based on the received activation request message.

For example, when NFC tags for providing specific information to the electronic device 101 are installed in various locations of a store, the electronic device 101 may receive a message requesting activation of an NFC module through a cellular network or a Wi-Fi network from an external electronic device which is located at an entrance of the shop. The control module 170 of the electronic device 101 may activate the NFC module of the electronic device 101 based on the received activation request message.

However, the communication module activated by the control module 170 may not be limited to using a local area communication network including the above-mentioned NFC network. For example, the control module 170 may activate at least one or more of cellular communication, GPS communication, and Wi-Fi communication based on a message for requesting activation of a communication module.

Figure 2A:
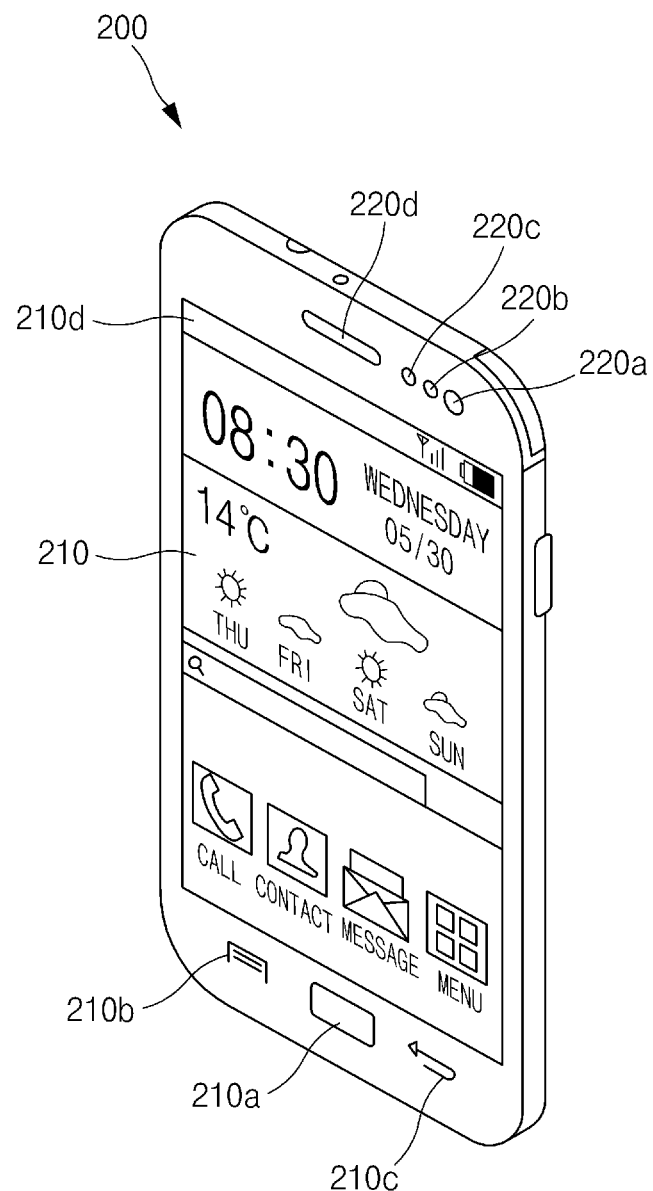
FIG. 2A is a perspective view illustrating a front surface of an electronic device according to various embodiments of the present disclosure.
Figure 2B:
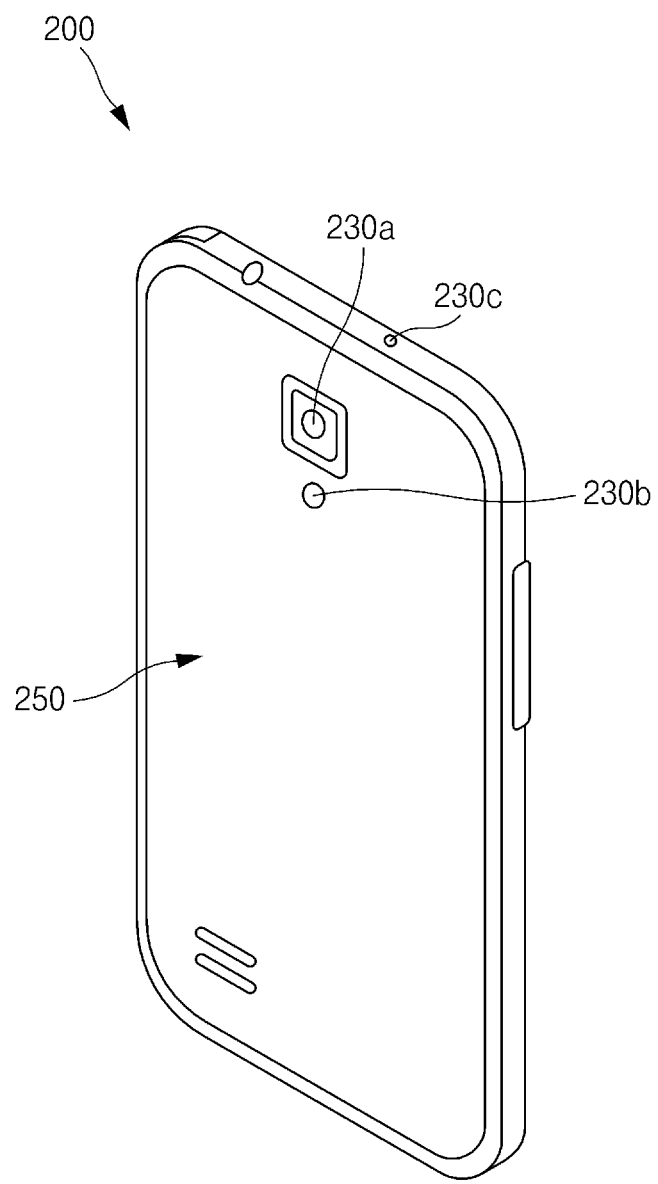
FIG. 2B is a perspective view illustrating a rear surface of an electronic device according to various embodiments of the present disclosure.

FIGS. 2A and 2B are perspective views illustrating front and rear surfaces of an electronic device according to various embodiments of the present disclosure. According to various embodiments of the present disclosure, an electronic device 200 may be embodied as, for example, a mobile communication terminal including a smartphone or a tablet personal computer (PC). Hereinafter, a description will be given in detail for a configuration of the electronic device 200 with reference to FIGS. 2A and 2B.

A touch screen 210 may be disposed on a front surface of the electronic device 200. The touch screen 210 may be largely formed to occupy most of the front surface of the electronic device 200. FIG. 2A illustrates an example in which a main home screen is displayed on the touch screen 210. The main home screen may be a screen displayed on the touch screen 210 when the electronic device 200 is changed from a locked state to an unlocked state. Also, when the electronic device 200 has different home screens of several pages, the main home screen may be a first home screen from among the home screens of the several pages. Shortcut icons for executing frequently used applications, a menu change icon, time, weather, and the like may be displayed on the home screen. A menu screen may be displayed on the touch screen 210 by selection of the menu change icon. Also, a status bar 210d which indicates statuses, such as a battery charge status, strength of a received signal, and a current time, may be formed in an upper end of the touch screen 210. In a lower portion of the touch screen 210, a home button 210a, a menu button 210b, and a back button 210c may be formed.

When the home button 210a is clicked or touched, the main home screen may be displayed on the touch screen 210. For example, in state where any home screen is displayed, which is different from the main home screen, or a menu screen is displayed on the touch screen 210, when the home button 210a is clicked or touched, the main home screen may be displayed on the touch screen 210. Also, when the home button 210a is clicked or touched while applications are executed on the touch screen 210, the main home screen may be displayed on the touch screen 210. Also, the home button 210a may be used to display recently used applications or a task manager. The menu button 210b may provide a connection menu which may be used on the touch screen 210. The connection menu may include a widget add menu, a background change menu, a search menu, an edit menu, an environment setting menu, and the like. The back button 210c may display a screen which is executed immediately before a currently executed screen, or may terminate the most recently used application.

With reference to FIG. 2A, a first camera 220a, an illumination sensor 220b, and a proximity sensor 220c may be disposed on the front surface of the electronic device 200. With reference to FIG. 2B, a second camera 230a, a flash 230b, and a speaker 230c may be disposed on a rear surface of the electronic device 200. If a battery pack is removably mounted on the electronic device 200, a bottom surface of the electronic device 200 may be a removable back housing 250.

An electronic device which will be subsequently described herein may have a removable battery pack. A back housing may be installed as a removable structure in the electronic device. Hereinafter, a description will be given for a configuration of an electronic device which includes a heat radiating antenna device, a back housing having the heat radiating antenna device, and a battery pack.

Figure 3:
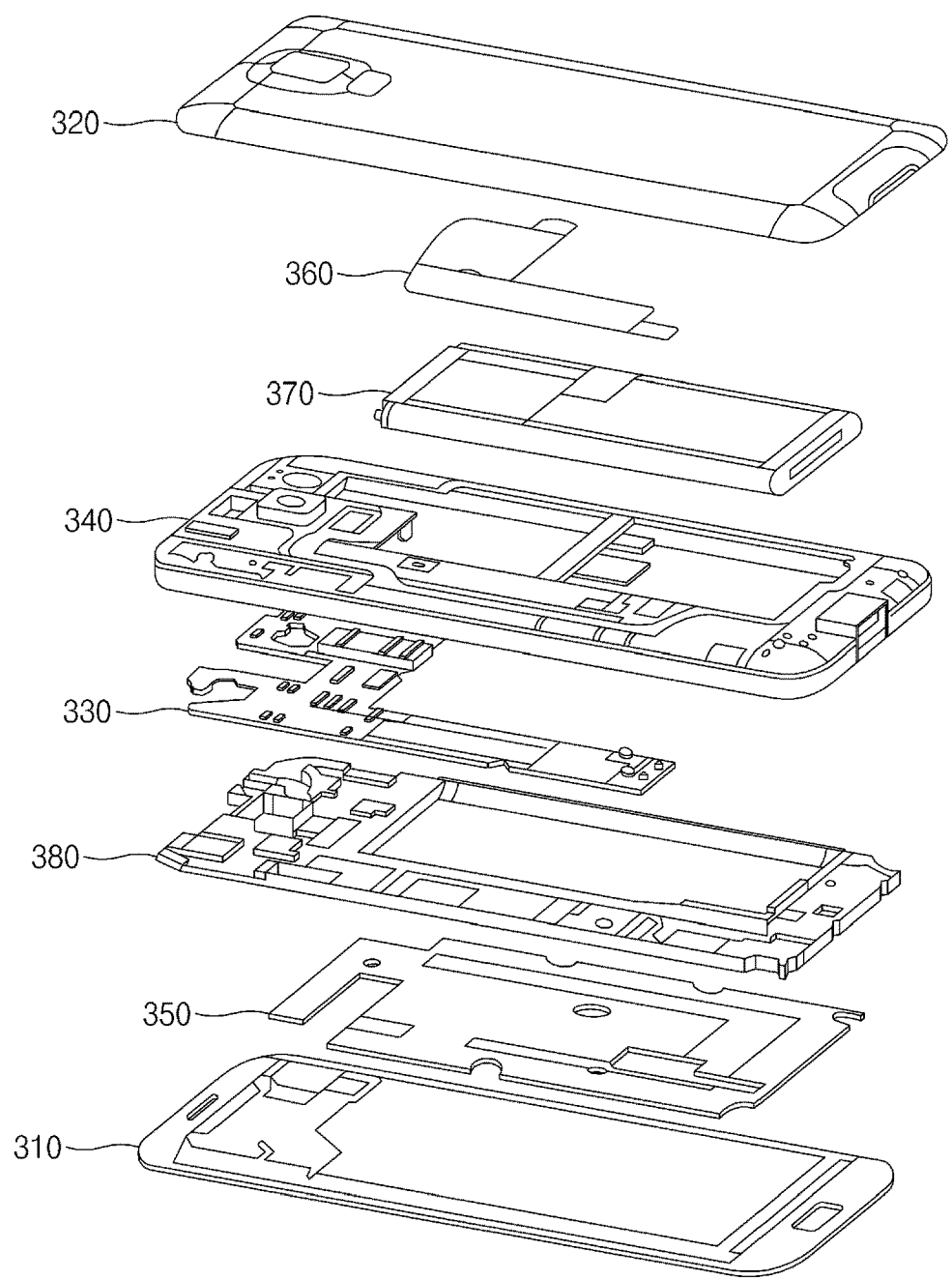
FIG. 3 is an exploded perspective view illustrating a configuration of an electronic device according to various embodiments of the present disclosure.

FIG. 3 is an exploded perspective view illustrating a configuration of an electronic device according to various embodiments of the present disclosure. Referring now to FIG. 3, an electronic device 300 may include a display 310 disposed on a front surface of the electronic device 300 and a back housing 320 disposed on a rear surface of the electronic device 300. A printed circuit board (PCB) 330 on which various electronic components are mounted, an internal supporting structure 340, and at least one heat radiating sheet 350 or more heat radiating sheets 350 may be installed between the display 310 and the back housing 320.

The internal supporting structure 340 may be a kind of a rear case, and may be a basic frame which supports the various mounted electronic components shown in FIG. 3. The internal supporting structure 340 may include at least one or more metal patterns. For example, the at least one metal pattern included in the internal supporting structure 340 may be configured with an antenna pattern. Also, the internal supporting structure 340 may include a space which accommodates a component including the at least one metal pattern. The component according to various embodiments of the present disclosure may be a battery pack 370. For example, the battery pack 370 may have the metal pattern on its one surface and may be accommodated in the internal supporting structure 340. For example, the metal pattern may be an NFC antenna.

With continued reference to FIG. 3. the internal supporting structure 340 may support the PCB 330. Also, the electronic device 300 may further include a front housing 380 which supports a variety of electronic components. The PCB 330 may be disposed between the internal supporting structure 340 and the front housing 380. The internal supporting structure 340, the PCB 330, and the front housing 380 may be combined with an up-and-down laminated structure, and may support a variety of electronic components. The internal supporting structure 340, the front housing 380, and the PCB 330 may have openings in which the battery pack 370 is placed, respectively.

Figure 4A:
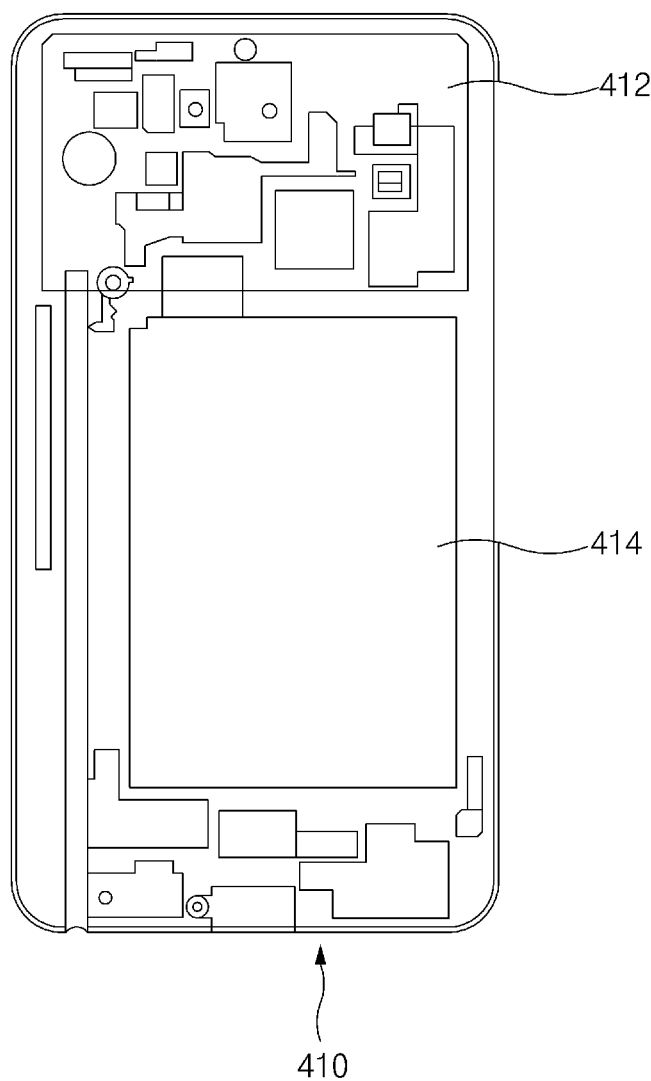
FIG. 4A and FIG. 4B are drawings illustrating an internal configuration of an electronic device including a conductor and an antenna according to various embodiments of the present disclosure.
Figure 4B:
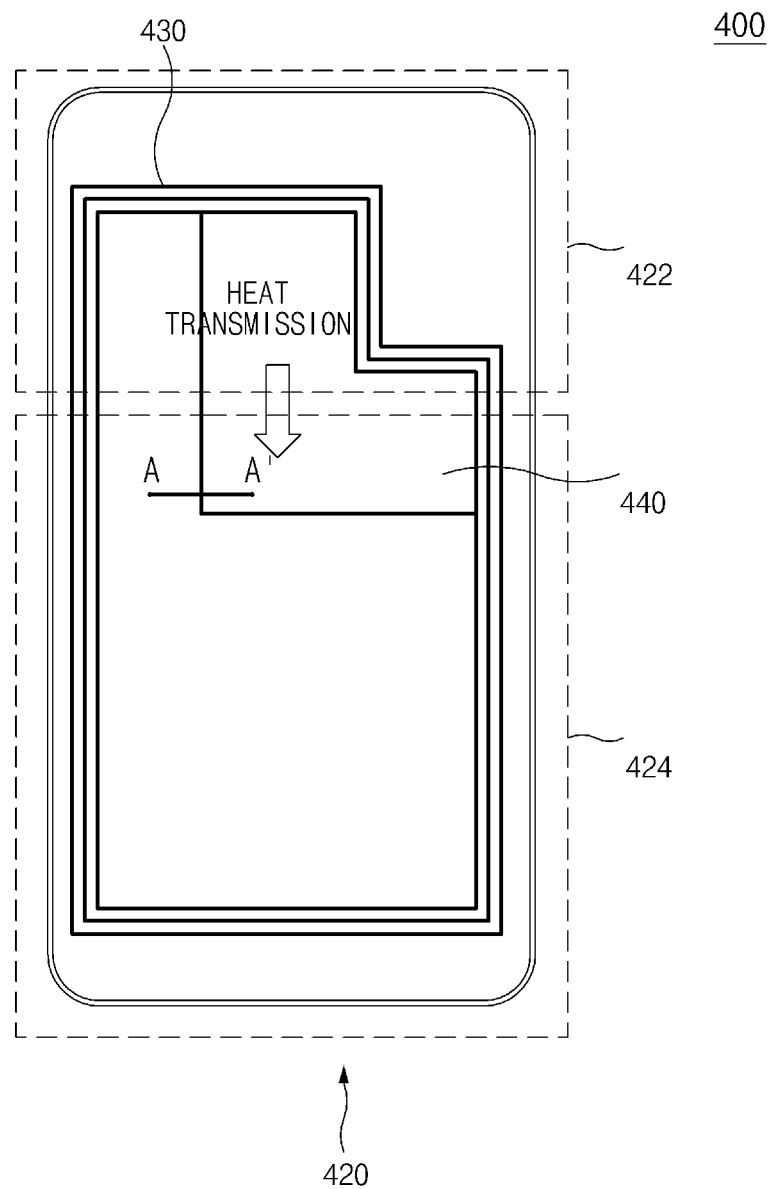

FIGS. 4A and 4B are drawings illustrating an internal configuration of an electronic device 400 including an antenna 430 and a conductor 440 according to various embodiments of the present disclosure.

FIG. 4A illustrates a front housing 410 (e.g., a front housing 380 of FIG. 3) of an electronic device 400. A main PCB 412 (e.g., a PCB 330 of FIG. 3) may be laminated on or under the front housing 410, and a battery 414 (e.g., a battery pack 370 of FIG. 3) may be inserted into the electronic device 400. For example, the battery 414 may be inserted into an internal supporting structure (e.g., an internal supporting structure 340 of FIG. 3) laminated on or under the front housing 410. However, at least one or more configurations which are laminated on/under the front housing 410 or inserted into the electronic device 400 may not be limited to the main PCB 412 and the battery 414. According to various embodiments of the present disclosure, for example, an image sensor, a power feeding part, and an antenna corresponding to a cellular network or an antenna corresponding to a Wi-Fi antenna, etc. may be installed in the main PCB 412 or a region corresponding to the main PCB 412. Also, because the main PCB 412 and the like are covered by a separate cover, they may not be exposure to the outside.

Because electric signals are transmitted and received between a plurality of electronic components including a printed circuit, chipsets (e.g., an application processor (AP), a communication processor (CP), and the like), and the like which are installed in the main PCB 412, the main PCB 412 may receive a relatively larger amount heat other components in the electronic device, and during operation the temperature of the PCB may become hotter than that of the battery 414.

However, the scope of the present disclosure is not limited to positions of the main PCB 412 and the battery 414 shown in FIG. 4A. For example, positions of the main PCB 412 and the battery 414 according to various embodiments of the present disclosure may be determined as a variety of positions. For example, the main PCB 412 may be located on a lower end of the front housing 410, and the battery 414 may be located on an upper end of the front housing 410. Also, regions where the main PCB 412 and the battery 414 are located may be spaced apart from each other. However, the main PCB 412 and the battery 414 may be overlapped with each other.

FIG. 4B illustrates a back housing 420 of the electronic device 400. The back housing 420 may include, for example, a first region 422, a second region 424, an antenna 430, and a conductor 440.

The back housing 420 may correspond to a rear surface of the electronic device 400, which is combined in a manufacturing stage of an integrated electronic device. However, the back housing 420 is not limited to being referred to as a part of the integrated electronic device. For example, the back housing 420 may be referred to as a battery case (cover) which may be opened and closed by a user to exchange the battery 414.

The first region 422 of the back housing 420 may correspond to the main PCB 412, and the second region 424 of the back housing 420 may correspond to the battery 414.

The electronic device 400 may be formed by combination of the front housing 410 and the back housing 420. Because the inside of the front housing 410 of FIG. 4A corresponds in size and shape to the inside of the back housing 420 of FIG. 4B, the electronic device 400 may be formed by stacking the inside of the front housing 410 and the inside of the back housing 420. In this case, the back housing 420 and the front housing 410 may be attached to each other such that the first region 422 of the back housing 420 faces the main PCB 412 and such that the second region 424 of the back housing 420 faces the battery 414. According to various embodiments of the present disclosure, the first region 422 of the back housing 420 and the main PCB 412 may be in contact with each other, and may be spaced from each other across a certain space or structure. Similarly, the second region 424 of the back housing 420 and the battery 414 may be in contact with each other, and may be spaced from each other across a certain space or structure.

The antenna 430 may be located over the first region 422 and the second region 424 of the back housing 420. Herein, FIG. 4B illustrates the antenna 430 as a loop antenna. However, the antenna 430 shown in FIG. 4B is provided for illustrative purposes, and the electronic device may have an antenna with various shapes or lengths to secure or procure a resonance length for receiving a signal of a desired frequency band. For example, the antenna 430 may have a shape of a monopole antenna, a dipole antenna, or an inverse F antenna. The antenna 430 may correspond to one of a variety of networks. FIG. 4B illustrates an example in which the antenna 430 may correspond to an NFC network. An operating frequency of the NFC antenna may be 13.56 MHz. A size of a wavelength corresponding to the corresponding frequency may be 22 meters. If the NFC antenna is implemented with a half-wavelength dipole antenna, the length of the wavelength may be 11 meters. Accordingly, the NFC antenna may be implemented with not a dipole antenna but a loop antenna. Hereinafter, a description will be given of an example in which the antenna 430 is the NFC antenna and has a loop-type pattern shown in FIG. 4B.

The antenna 430 may have an accurate loop-type pattern. However, as shown in FIG. 4B, when at least a part of the antenna 430 gets out of the loop-type pattern, it may also be shown that the pattern of the antenna 430 is the loop-type pattern. For example, at least a part of the antenna 430 may become convex or concave on the loop-type pattern in at least one variety directions (e.g., a horizontal direction or a vertical direction) from the same plane where the antenna 430 is located. This is because the loop pattern may be partially modified to mount the antenna 430 on a space limited due to electronic components, such as the main PCB 412 including a plurality of chipsets, the battery 414, and an antenna.

Due to a communication range of the NFC antenna being relatively short (about 10 cm), the NFC antenna may be located on an inner surface of the back housing 420 as shown in FIG. 4B to communicate with an external NFC reader or an external NFC tag. The larger a loop size, the greater the strength of a communication signal transmitted by the loop antenna. The greater the quantity of loops that forms the loop antenna, the greater the strength of the communication signal of the loop antenna. Therefore, if the strength of the communication signal of the loop antenna is determined, the pattern of the antenna 430 may be designed in consideration of the determined strength of the communication signal. In addition, the pattern of the antenna 430 may be determined in consideration of heat radiation performance according to a position or a shape of a conductor 440 which will be described herein after, and in consideration of performance according to the pattern of the antenna 430 to be determined as above.

As described above, a temperature of the main PCB 412 during operation of the electronic device may be higher than that of the battery 414. Accordingly, with reference to FIG. 4B, the first region 422 may have a relatively higher temperature than that of the second region 424. Accordingly, the electronic device 400 may further include the conductor 440 which may transmit heat of the first region 422 to the second region 424 which has a low temperature relatively. In this case, the conductor 440 may be located over the first region 422 and the second region 424, and may also be located on only the first region 422. The term "transmit heat" is to be understood by a person of ordinary skill in the art as a combination of heat transference by one or more of conduction, convection and radiation.

The conductor 440 may be located on the first region 422 and the second region 424 to occupy an equal area on them, respectively. However, as shown in FIG. 4B, the conductor 440 may be located on the second region 424 to be positioned over a larger portion of the second region than a portion located on the first region 422. Due to at least one or more other antennas being located on the main PCB 412 or the region corresponding to the main PCB 412, the conductor 440, which has metallic materials, may degrade radio frequency (RF) performance of the at least one or more other antennas. Accordingly, to prevent the RF performance from being degraded, the conductor 440 may be located on the second region 424 so as to be positioned over a larger portion of the second region than the portion located on the first region 422. A position or a shape of the conductor 440 may be determined according to performance according to the pattern of the antenna 430 and heat radiation performance according to the position or the shape of the conductor 440 to be determined. Also, the position or the shape of the conductor 440 may be determined in consideration of heat radiation performance of the conductor 440 without degrading RF performance of other antennas which are located on the main PCB 412 or a position corresponding to the main PCB 412.

The antenna 430 and the conductor 440 may be located so as to be adjacent to each other. If the conductor 440 is not adjacent to the antenna 430, the conductor 440 operates as an element which jams the radiation of the antenna 430. Accordingly, the conductor 440 may be designed to be adjacent to at least a part of the antenna 430. In this case, the conductor 440 may operate as a part of the antenna 430. In some embodiments, the conductor and antenna can be disposed on a same surface.

Positions of the first region 422 and the second region 424 may be changed according to positions of the main PCB 412 and the battery 414 according to various embodiments of the present disclosure.

The front housing 410 or the back housing 420 may further include holes corresponding to a power button, a volume control button, a speaker, an earphone socket, and a charging socket.

Figure 5A:
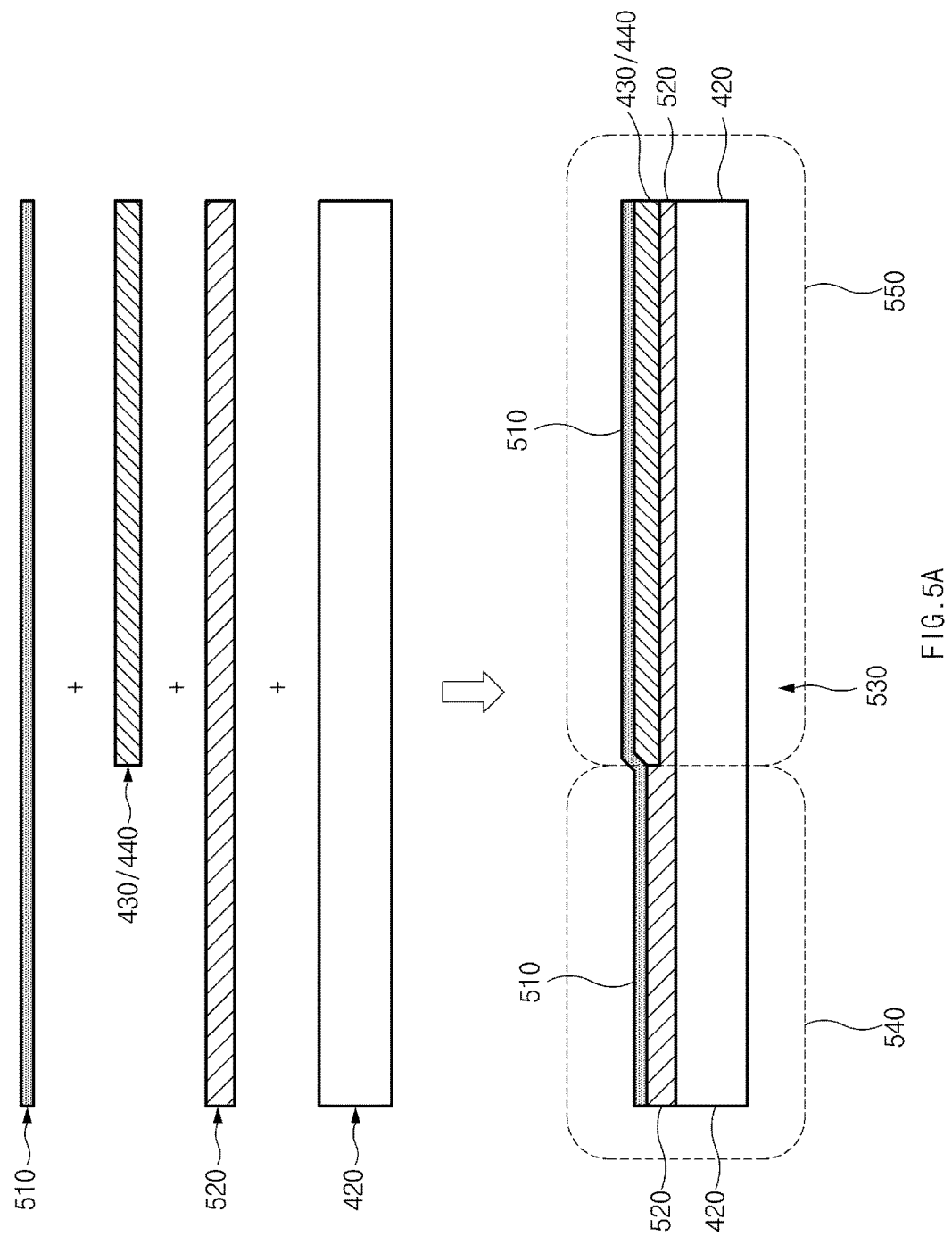
FIG. 5A is a drawing illustrating a method of forming an antenna and a conductor on an inner surface of a back housing of an electronic device according to various embodiments of the present disclosure.

FIG. 5A is a drawing illustrating a method of forming an antenna 430 and a conductor 440 on an inner surface of a back housing 420 of an electronic device 400 according to various embodiments of the present disclosure. Also, FIG. 5A illustrates a cross-sectional view taken along A-A' line of FIG. 4B.

The antenna 430 and the conductor 440 may be installed or mounted in the electronic device 400 of FIG. 4B by various methods. For example, the antenna 430 and the conductor 440 may be installed in the electronic device 400 by attaching a sheet including the antenna 430 and the conductor 440 to one surface of the electronic device 400. The sheet including the antenna 430 and the conductor 440 may be installed in the electronic device 400 by injecting the sheet including the antenna 430 and the conductor 440 together when a back housing 420 is injected. In each case, the antenna 430 and the conductor 440 may be installed in the electronic device 400 with them included in different sheets or the same sheet. Otherwise, the antenna 430 and the conductor 440 may not be formed on a separate sheet but be directly formed on the back housing 420 of the electronic device 400. Herein, the antenna 430 and the conductor 440 according to various embodiments of the present disclosure may be formed on a front housing 420 of the electronic device 400.

A description will now be provided of an example in which the antenna 430 and the conductor 440 are formed on the back housing 420 by a laser direct structuring (LDS) plating method with reference to FIG. 5A.

The LDS plating method is a method of working a pattern of a desired shape by eroding a thermoplastic resin (plastic injection molded product), for example, the inside of the back housing 420 of the electronic device 400 using laser beams and by plating the processed pattern. The laser work may make a surface of the thermoplastic resin rough to plate the surface of the thermoplastic resin. According to various embodiments of the present disclosure, the LDS plating method may use copper (Cu), and may use nickel (Ni) or gold (Au). Copper, nickel, or gold used in the LDS plating method may be selectively or successively used. However, metal components used in the LDS plating method may not be limited to copper, nickel, or gold.

FIG. 5A illustrates a partial cross-section of a protective painting layer 510, the antenna 430 and the conductor 440, an LDS coating layer 520, and the back housing 420. Referring to a drawing shown in an upper end of FIG. 5A, the protective painting layer 510, the antenna 430 and the conductor 440, and the LDS coating layer 520 may be formed on an inner surface of the back housing 420. The LDS coating layer 520 may be formed by coating LDS paints on the inner surface of the back housing 420. Also, the antenna 430 and the conductor 440 may be formed on the formed LDS coating layer 520 through the LDS plating method. In addition, the protective painting layer 510 may be formed on the antenna 430 and the conductor 440 which are formed by the LDS plating method.

According to various embodiments of the present disclosure, the antenna 430 and the conductor 440 may be formed in opposite order of how they are shown in FIG. 5A. When the LDS plating method is selected, the antenna 430 and the conductor 440 may be formed in one process. In this case, the LDS plating method may have an advantage in which a process time of the antenna 430 and the conductor 440 may be shortened.

A drawing shown in a lower end of the FIG. 5A is at least a partial cross-section 530 of the back housing 420 in which the protective painting layer 510, the antenna 430 and the conductor 440, and the LDS coating layer 520, which are shown in the upper end of the FIG. 5A, are formed. As described above, the drawing shown in the lower end of the FIG. 5A illustrates a cross-section taken along A-A' line of FIG. 4B as described above.

Due to the LDS plating method of forming the antenna 430 and the conductor 440 causes erosion of the LDS coating layer 520 using laser beam, at least a part of the LDS coating layer 520 on which a pattern corresponding to the antenna 430 and the conductor 440 is formed may be reduced in thickness. Accordingly, referring to the at least partial cross-section 530 of the back housing 420, it can be seen that there is difference between thicknesses of the LDS coating layers 520 in an LDS non-plating region 540 and an LDS plating region 550.

According to various embodiments of the present disclosure, LDS paints may be coated on the inner surface of the back housing 420 along the pattern of the antenna 430 and the conductor 440 to be formed on the inner surface of the back housing 420. Also, according to various embodiments of the present disclosure, the protective painting layer 510 may be formed along the pattern of the antenna 430 and the conductor 440. In this case, there may not be the LDS non-plating region 540. However, as described above, the antenna 430 may have a complicated pattern such as the pattern of the antenna 430 is not an accurate loop pattern and at least a part of the pattern of the antenna 430 becomes convex or concave. Also, the conductor 440 adjacent to the antenna 430 may have a complicated shape. Accordingly, to quickly perform a process of the antenna 430 and the conductor 440, the protective painting layer 510 or the LDS coating layer 520 may be coated on the inner surface of the back housing 420 not to be identical to the pattern of the antenna 430 and the conductor 440. Also, due to the above-mentioned reason, the at least partial cross section 530 of the back housing 420 may include the LDS non-plating region 540 which has a thickness of the LDS coating layer 520 which is different from that of the LDS plating region 550.

The drawing shown in the lower end of the FIG. 5A illustrates the at least partial cross-section 530 of the back housing 420. For example, another region (which is not shown in FIG. 5A) in which the LDS coating layer 520 is not eroded may be further exist beside the LDS plating region 550.

According to various embodiments of the present disclosure, the protective painting layer 510 may be provided to prevent damage such as when the LDS-plated antenna 430 and conductor 440 are scratched. The LDS coating layer 520 may be for radiating heat. Accordingly, the protective painting layer 510 or the LDS coating layer 520 may be omitted. If the LDS coating layer 520 is omitted, the inner surface of the back housing 420 may be eroded by LDS plating. In this case, similarly in the LDS coating layer 520, thicknesses of the back housing 420 may be different from each other in the LDS no-plating region 540 and the LDS plating region 550.

FIG. 5B is a drawing illustrating a table with exemplary thicknesses for at least a partial cross section of a back housing according to various embodiments of the present disclosure. A thickness of the back housing 420 of the electronic device 400 is omitted in FIG. 5B.

Referring now to FIG. 5B, a protective painting layer 510 of FIG. 5A may generally have certain thicknesses about 35 μm to about 40 μm irrespective of LDS plating. Herein, it may be known that thicknesses of an LDS coating layer 520 are different from each other in an LDS plating case and an LDS no-plating case. The thickness of the LDS coating layer 520 in the LDS no-plating case may be about 20 μm to about 25 μm. The thickness of the LDS coating layer 520 in the LDS plating case may be about 10 μm to about 15 μm. In other words, about 10 μm which is difference between the thicknesses of the LDS coating layer 520 according to whether LDS plating is performed may indicate thickness eroded by LDS plating. Also, the LDS plating means that an antenna 430 and a conductor 440 are formed. Accordingly, thicknesses of an LDS plating layer may be about 25 μm to about 30 μm. Accordingly, except the thickness of the back housing 420 omitted in FIG. 5B, thicknesses of an LDS no-plating region 540 may be about 55 μm to about 65 μm and thicknesses of an LDS plating region 550 may be about 70 μm to about 85 μm. Accordingly, there may be a little difference between the LDS no-plating region 540 and the LDS plating region 550 due to the LDS plating layer and the LDS coating layer 520. Herein, as described above, the protective painting layer 510 and the LDS coating layer 520 are omitted, the entire thickness may be thinner.

FIG. 6 is a drawing illustrating a thermographic image 610 and a thermographic image 620 in which a rear surface of an electronic device is captured according to kinds of paints used for LDS coating according to various embodiments of the present disclosure.

Referring now to FIG. 6, the thermographic image 610 and the thermographic image 620 are shown in the left and the right of FIG. 6, respectively. A density table 630 indicating densities displayed on thermographic images according to temperatures is shown in the middle of FIG. 6. When reference paints are used for LDS coating, the thermographic image 610 may be an image in which a rear surface of an electronic device 400 of FIG. 4B is captured using a thermographic camera. When LDS paints are used for LDS coating, the thermographic image 620 may be an image in which the rear surface of the electronic device 400 is captured using the thermographic camera.

A region 615 which has a relatively high temperature in the thermographic image 610 will be compared with a region 625 of the thermographic image 620, corresponding to the region 615. Referring to the density table 630, it may be known that the region 615 indicates about 45 degrees C. and the region 625 indicates about 43 degrees C. Accordingly, it may be known that heat radiation effect is higher when the LDS paints are used for LDS coating in comparison with when the reference paints are used for LDS coating.

Figure 7A:
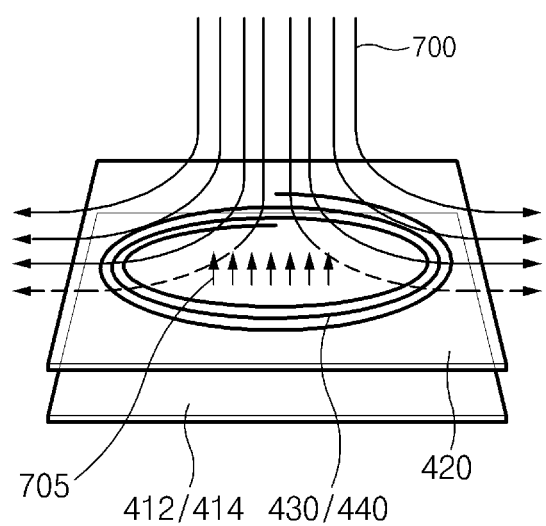
FIG. 7A and FIG. 7B are drawings illustrating magnetic flux according to whether a shielding sheet for suppressing eddy current is used according to various embodiments of the present disclosure.
Figure 7B:
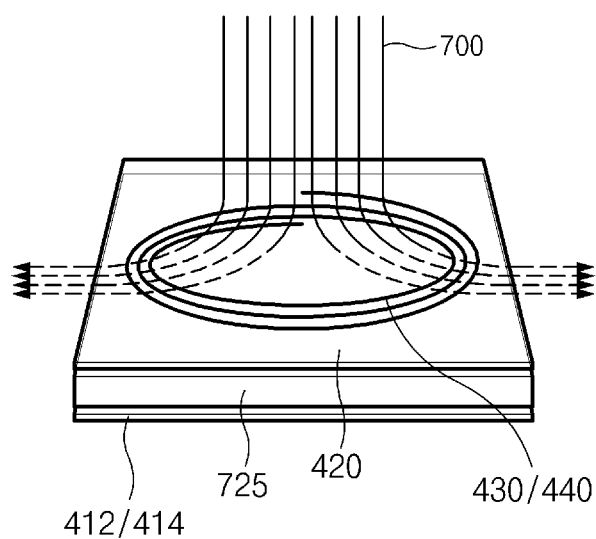

FIGS. 7A and 7B are drawings illustrating magnetic flux according to whether a shielding sheet for suppressing eddy current is used according to various embodiments of the present disclosure.

Referring to FIGS. 7A and 7B, an NFC antenna may be a loop antenna and a wire loop which forms the loop antenna may operate as an inductor. For example, if a first loop antenna is adjacent to a second loop antenna, an induced current may be generated in the second loop antenna. In other words, when an electronic device 400 of FIG. 4B having the NFC antenna is located within an effective communicative range with an NFC reader, the NFC reader may induce a magnetic field through a loop antenna of the NFC reader. Also, the induced magnetic field may induce current in the NFC antenna of the electronic device 400. The electronic device 400 may perform NFC with the NFC reader by reading the induced current. To use this non-contact energy transmission is the principle of NFC. Herein, the NFC antenna may be installed inside of the electronic device 400, and may be located near or on metal. The metal may reduce inductance of the loop antenna and may induce eddy current.

FIGS. 7A and 7B illustrate an example in which a magnetic field 700 is provided in the direction of an antenna 430 and a conductor 440. In FIG. 7A, a shielding sheet 725 for suppressing eddy current is not installed. In FIG. 7B, the shielding sheet 725 for suppressing eddy current is installed. FIGS. 7A and 7B illustrate an influence of the magnetic field 700 on the antenna 430 and the conductor 440 according to whether the shielding sheet 725 for suppressing eddy current is installed.

Referring now to FIG. 7A, the magnetic field 700 may generate eddy current in a main PCB 412 or a battery 412 which includes metal components. Also, the generated eddy current may generate a magnetic field 705 having an opposite direction of the magnetic field 700 from the antenna 430 and the conductor 440 according to the Lenz's law.

The magnetic field 705 of the opposite direction may degrade the performance of NFC. A method of preventing the NFC from being degraded or failing may include, for example, forming a space between the antenna 430 and conductor 440 and a metal surface (e.g., a surface of the main PCB 412 or the battery 414). For example, in case of 13.56 MHz, if a free space of about 2 cm to about 3 cm is formed between the antenna 430 and conductor 440 and the metal surface, the NFC may be prevented from being degraded or failing. Herein, if the electronic device 400 has a small size, it is difficult to form the free space of about 2 cm to about 3 cm.

Referring now to FIG. 7B, the electronic device 400 according to various embodiments of the present disclosure may include the shielding sheet 725 for suppressing eddy current between the antenna 430 and conductor 440 and the metal surface (e.g., the surface of the main PCB 412 or the battery 414). The shielding sheet 725 for suppressing eddy current may be a magnetic sheet having high magnetic permeability and may be located between the antenna 430 and conductor 440 and the metal surface. A relative distance between the antenna 430 and conductor 440 and the metal surface may be increased through the shielding sheet 725 for suppressing eddy current. Accordingly, the magnetic field 700 may flow in the antenna 430 and the conductor 440 without being influenced by the magnetic field 705 of the opposite direction.

According to various embodiments of the present disclosure, the electronic device 400 may include, for example, a flexible electromagnetic (EM) wave absorber of a polymer type or a ferrite sheet as the shielding sheet 725 for suppressing eddy current.

According to various embodiments of the present disclosure, the electronic device may include, for example, the antenna configured to be located over the first region and the second region and the conductor configured to transmit heat of the first region to the second region. The conductor may operate as at least a part of the antenna and may be adjacent to the at least a part of the antenna.

According to various embodiments of the present disclosure, the conductor may be located over the first region and the second region.

According to various embodiments of the present disclosure, the antenna and the conductor may be located on the inner surface of the back housing of the electronic device, and may be located on the inner surface of the battery case (cover) of the electronic device.

According to various embodiments of the present disclosure, the first region may correspond to the main PCB of the electronic device and the second region may correspond to the battery of the electronic device.

According to various embodiments of the present disclosure, the antenna may correspond to the NFC network and may include at least a part of the pattern of the loop antenna.

According to various embodiments of the present disclosure, the antenna and the conductor may be formed on the inside of the electronic device by the LDS method.

According to various embodiments of the present disclosure, the electronic device may further include the LDS coating layer on which the antenna and the conductor are formed. Also, the electronic device may further include the protective painting layer formed on the antenna and the conductor.

According to various embodiments of the present disclosure, the electronic device may further include the shielding sheet for suppressing eddy current, which is located on the antenna and the conductor. For example, the shielding sheet for suppressing eddy current may include the ferrite sheet.

According to various embodiments of the present disclosure, the antenna and the conductor may be simultaneously formed as one pattern.

According to various embodiments of the present disclosure, the pattern of the antenna may be determined in consideration of the heat radiation performance according to the position or the shape of the conductor and the performance according to the pattern of the antenna to be determined. Similarly, the position or the shape of the conductor may be determined in consideration of the performance according to the pattern of the antenna and the heat radiation performance according to the position or the shape of the conductor to be determined.

Figure 8:
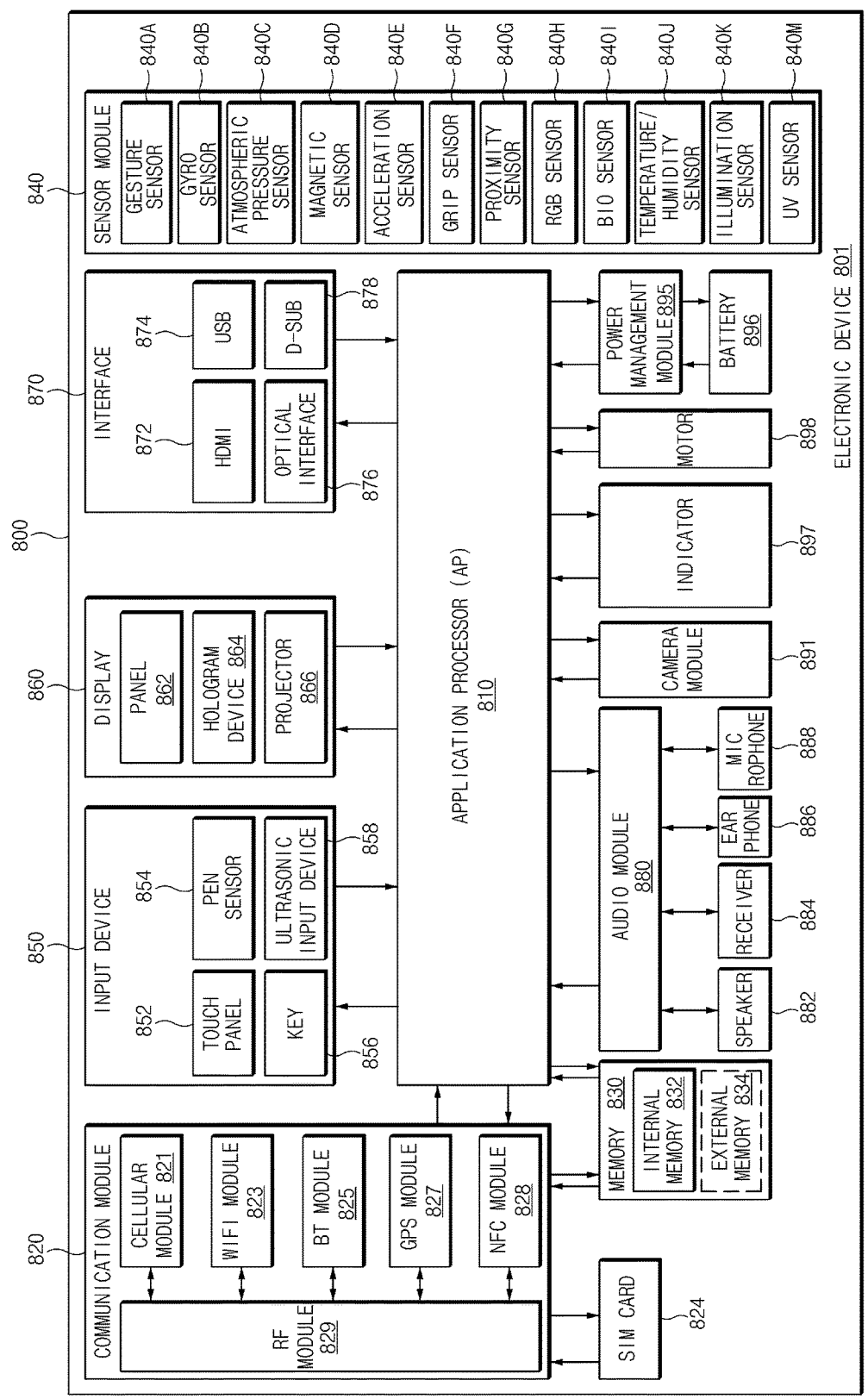
FIG. 8 is a block diagram of an electronic device according to various embodiments of the present disclosure.

FIG. 8 is a block diagram 800 of an electronic device 801 according to various embodiments of the present disclosure. An electronic device 801 may include a part or all of components of an electronic device 101 shown in FIG. 1. Referring now to FIG. 8, the electronic device 801 may include one or more application processors (AP) 810, a communication module 820, a subscriber identification module (SIM) card 824, a memory 830, a sensor module 840, an input device 850, a display module 860, an interface 870, an audio module 880, a camera module 891, a power management module 895, a battery 896, an indicator 897, and a motor 898.

The AP 810 may drive an operating system (OS) or an application to control a plurality of hardware or software components connected to the AP 810, and may process and compute a variety of data including multimedia data. The AP 810 may be implemented with, for example, a System on Chip (SoC), for example. According to an embodiment of the present disclosure, the AP 810 may further include a graphic processing unit (GPU, not illustrated).

The communication module 820 (e.g., the communication interface 160) may transmit and receive data when there are conveyed communications between other electronic devices (e.g., an electronic device 104 or a server 106) connected with the electronic device 801 (e.g., the electronic device 101) through a network. According to an embodiment of the present disclosure, the communication module 820 may include a cellular module 821, a wireless-fidelity (Wi-Fi) module 823, a Bluetooth (BT) module 825, a global positioning system (GPS) module 827, a near field communication (NFC) module 828, and a radio frequency (RF) module 829.

The cellular module 821 may provide voice communication, video communication, a character service, an Internet service, and the like through a communication network (e.g., an LTE, an LTE-A, a CDMA, a WCDMA, a UMTS, a WiBro, a GSM, or the like). Also, the cellular module 821 may perform discrimination and authentication of an electronic device within a communication network using, for example, a SIM (e.g., a SIM card 824). According to an embodiment of the present disclosure, the cellular module 821 may perform at least a portion of functions that the AP 810 provides. For example, the cellular module 821 may perform at least a portion of a multimedia control function.

According to an embodiment of the present disclosure, the cellular module 821 may include a communication processor (CP). Also, the cellular module 821 may be implemented with, for example, a SoC. In FIG. 8, components such as the cellular module 821 (e.g., a communication processor), the memory 830, the power management module 895, and the like may be illustrated as being components independent of the AP 810, but, according to an embodiment of the present disclosure, the AP 810 may be implemented to include at least a portion (e.g., a cellular module 821) of the above-described components.

According to an embodiment of the present disclosure, the AP 810 or the cellular module 821 (e.g., a communication processor) may load, on a volatile memory, a command or data received from at least one of a nonvolatile memory and another element connected to the AP 810 or the cellular module 821, so as to process the command or data. Furthermore, the AP 810 or the cellular module 821 may store, in the nonvolatile memory, data received from or generated by at least one of the other elements.

Each of the Wi-Fi module 823, the BT module 825, the GPS module 827, and the NFC module 828 may include, for example, a processor for processing data exchanged through a corresponding module. In FIG. 8, each of the cellular module 821, the Wi-Fi module 823, the BT module 825, the GPS module 827, and the NFC module 828 may be illustrated as being separate blocks, but, according to an embodiment of the present disclosure, at least a portion (e.g., two or more components) of the cellular module 821, the Wi-Fi module 823, the BT module 825, the GPS module 827, and the NFC module 828 may be included within one Integrated Circuit (IC) or an IC package. For example, at least a portion (e.g., a communication processor corresponding to the cellular module 821 and a Wi-Fi processor corresponding to the Wi-Fi module 823) of communication processors corresponding to the cellular module 821, the Wi-Fi module 823, the BT module 825, the GPS module 827, and the NFC module 828 may be implemented with one SoC.

The RF module 829 may transmit/receive data, for example, may transmit/receive an RF signal. Although not illustrated, for example, a transceiver, a power amplifier module (PAM), a frequency filter or low noise amplifier (LNA) may be included in the RF module 829. Furthermore, the RF module 829 may further include a component, such as a conductor or a wire for transmitting/receiving free-space electromagnetic waves in a wireless communication system. In FIG. 8, the cellular module 821, the Wi-Fi module 823, the BT module 825, the GPS module 827, and the NFC module 828 may be illustrated as sharing one RF module 829, but, according to an embodiment of the present disclosure, at least one of the cellular module 821, the Wi-Fi module 823, the BT module 825, the GPS module 827, or the NFC module 828 may transmit and receive an RF signal through an additional RF module.

The SIM card 824 may be inserted to a slot formed at a specific position of the electronic device. The SIM card 824 may include unique identify information (e.g., an integrated circuit card identifier (ICCID)) or subscriber information (e.g., integrated mobile subscriber identity (IMSI)).

The memory 830 (e.g., the memory 130) may include an embedded memory 832 or an external memory 834. For example, the embedded memory 832 may include at least one of a volatile memory (e.g., a dynamic random access memory (DRAM), a static RAM (SRAM), or a synchronous DRAM (SDRAM)) and a nonvolatile memory (e.g., a one-time programmable read only memory (OTPROM), a programmable ROM (PROM), an erasable and programmable ROM (EPROM), an electrically erasable and programmable ROM (EEPROM), a mask ROM, a flash ROM, a NAND flash memory, or a NOR flash memory).

According to an embodiment of the present disclosure, the internal memory 832 may be a solid state drive (SSD). The external memory 834 may include a flash drive, for example, compact flash (CF), secure digital (SD), micro secure digital (Micro-SD), mini secure digital (Mini-SD), extreme digital (xD) or a memory stick. The external memory 834 may be functionally connected to the electronic device 801 through various interfaces. According to an embodiment of the present disclosure, the electronic device 801 may further include a storage device (or a storage medium), such as a hard drive.

The sensor module 840 may measure a physical quantity or may detect an operation state of the electronic device 801. The sensor module 840 may convert the measured or detected information to an electric signal. The sensor module 840 may include, for example, at least one of a gesture sensor 840A, a gyro sensor 840B, a pressure sensor 840C, a magnetic sensor 840D, an acceleration sensor 840E, a grip sensor 840F, a proximity sensor 840G, a color sensor 840H (e.g., red, green, blue (RGB) sensor), a living body sensor 840I, a temperature/humidity sensor 840J, an illuminance sensor 840K, or an ultraviolet (UV) sensor 840M. Although not illustrated, additionally or generally, the sensor module 840 may further include, for example, an E-nose sensor, an electromyography sensor (EMG) sensor, an electroencephalogram (EEG) sensor, an electrocardiogram (ECG) sensor, a photoplethysmographic (PPG) sensor, an infrared (IR) sensor, an iris sensor, a fingerprint sensor, and the like. The sensor module 840 may further include a control circuit for controlling at least one or more sensors included therein.

The input device 850 may include a touch panel 852, a (digital) pen sensor 854, a key 856, or an ultrasonic input unit 858. The touch panel 852 may recognize a touch input using at least one of capacitive, resistive, infrared and ultrasonic detecting methods. Furthermore, the touch panel 852 may further include a control circuit. In the case of using the capacitive detecting method, a physical contact recognition or proximity recognition is allowed. The touch panel 852 may further include a tactile layer. In this case, the touch panel 852 may provide a tactile reaction to a user. The touch panel 852 may generate a touch event associated with execution of a specific function using position associated information.

The (digital) pen sensor 854 may be implemented in a similar or same manner as the method of receiving a touch input of a user or may be implemented using an additional sheet for recognition. The key 856 may include, for example, a physical button, an optical key, a keypad, and the like. The ultrasonic input device 858, which is an input device for generating an ultrasonic signal, may enable the electronic device 801 to sense detect a sound wave through a microphone (e.g., a microphone 888) so as to identify data, wherein the ultrasonic input device 858 is capable of wireless recognition. According to an embodiment of the present disclosure, the electronic device 801 may use the communication module 820 so as to receive a user input from an external device (e.g., a computer or server) connected to the communication module 820.

The display module 860 (e.g., the display 150) may include a panel 862, a hologram device 864, or a projector 866. The panel 862 may be a liquid-crystal display (LCD) or an active-matrix organic light-emitting diode (AMOLED). The panel 862 may be, for example, flexible, transparent or wearable. The panel 862 and the touch panel 852 may be integrated into a single module. The hologram device 864 may display a stereoscopic image in a space using a light interference phenomenon. The projector 866 may project light onto a screen so as to display an image. The screen may be arranged inside or outside of the electronic device 801. According to an embodiment of the present disclosure, the display module 860 may further include a control circuit for controlling the panel 862, the hologram device 864, or the projector 866.

The interface 870 may include, for example, an HDMI (high-definition multimedia interface) 872, a USB (universal serial bus) 874, an optical interface 876, or a D-sub (D-subminiature) 878. The interface 870 may include, for example, a mobile high definition link (MHL) interface, a SD card/multi-media card (MMC) interface, or an infrared data association (IrDA) standard interface.

The audio module 880 may convert a sound and an electric signal in dual directions. The audio module 880, for example, may process sound information that is input or output through a speaker 882, a receiver 884, an earphone 886, or a microphone 888.

The camera module 891 for shooting a still image or a video may include at least one image sensor (e.g., a front sensor or a rear sensor), a lens (not illustrated), an image signal processor (ISP, not illustrated), or a flash (e.g., an LED or a xenon lamp, not illustrated).

The power management module 895 may manage power of the electronic device 801. Although not illustrated, a power management integrated circuit (PMIC) a charger IC, or a battery or fuel gauge may be included in the power management module 895.

The PMIC may be mounted on an integrated circuit or a SoC semiconductor. A charging method may be classified into a wired charging method and a wireless charging method. The charger IC may charge a battery, and may prevent an overvoltage or an overcurrent from being introduced from a charger. According to an embodiment of the present disclosure, the charger IC may include a charger IC for at least one of the wired charging method and the wireless charging method. The wireless charging method may include, for example, a magnetic resonance method, a magnetic induction method or an electromagnetic method, and may include an additional circuit, for example, a coil loop, a resonant circuit, or a rectifier, and the like.

The battery gauge may measure, for example, a remaining capacity of the battery 896 and a voltage, current or temperature thereof while the battery is charged. The battery 896 may store or generate electricity, and may supply power to the electronic device 801 using the stored or generated electricity. The battery 896 may include, for example, a rechargeable battery or a solar battery.

The indicator 897 may display a specific state of the electronic device 801 or a part thereof (e.g., the AP 810), such as a booting state, a message state, a charging state, and the like. The motor 898 may convert an electrical signal into a mechanical vibration. Although not illustrated, a processing device (e.g., a GPU) for supporting a mobile TV may be included in the electronic device 801. The processing device for supporting a mobile TV may process media data according to the standards of DMB, digital video broadcasting (DVB) or media flow.

Each of the above-mentioned elements of the electronic device according to various embodiments of the present disclosure may be configured with one or more components, and the names of the elements may be changed according to the type of the electronic device. The electronic device according to various embodiments of the present disclosure may include at least one of the above-mentioned elements, and some elements may be omitted or other additional elements may be added. Furthermore, some of the elements of the electronic device according to various embodiments of the present disclosure may be combined with each other so as to form one entity, so that the functions of the elements may be performed in the same manner as before the combination.

The term "module" used herein may represent, for example, a unit including combinations of hardware, software and firmware. The term "module" may be interchangeably used with the terms "unit", "logic", "logical block", "component" and "circuit". The "module" may be a minimum unit of an integrated component or may be a part thereof. The "module" may be a minimum unit for performing one or more functions or a part thereof. The "module" may be implemented mechanically or electronically. For example, the "module" according to various embodiments of the present disclosure may include at least one of an application-specific IC (ASIC) chip, a field-programmable gate array (FPGA), and a programmable-logic device for performing some operations, which are known or will be developed.

According to various embodiments of the present disclosure, at least a portion of an apparatus (e.g., modules or functions thereof) or a method (e.g., operations) according to various embodiments of the present disclosure, for example, may be implemented by instructions stored in a computer-readable storage media in the form of a programmable module. The instruction, when executed by one or more processors (e.g., the processor 120), may perform a function corresponding to the instruction. The computer-readable storage media may be, for example, the memory 130. At least a portion of the programming module may be implemented (e.g., executed), for example, by the processor 120. At least a portion of the programming module may include the following for performing one or more functions: a module, a program, a routine, sets of instructions, or a process.

A computer-readable recording medium may include a hard disk, a magnetic media such as a floppy disk and a magnetic tape, an optical media such as Compact Disc Read Only Memory (CD-ROM) and a Digital Versatile Disc (DVD), a magneto-optical media such as a floptical disk, and the following hardware devices specifically configured to store and perform a program instruction (e.g., a programming module): Read Only Memory (ROM), Random Access Memory (RAM), and a flash memory. Also, a program instruction may include not only a mechanical code such as things generated by a compiler but also a high-level language code executable on a computer using an interpreter. The above hardware unit may be configured to operate via one or more software modules for performing an operation of the present disclosure, and vice versa.

A module or a programming module according to an embodiment of the present disclosure may include at least one of the above elements, or a portion of the above elements may be omitted, or additional other elements may be further included. Operations performed by a module, a programming module, or other elements according to an embodiment of the present disclosure may be executed sequentially, in parallel, repeatedly, or in a heuristic method. Also, a portion of operations may be executed in different sequences, omitted, or other operations may be added.

The electronic device according to various embodiments of the present disclosure may transmit heat of one region thereof, which has a high temperature relatively, to another region thereof which has a low temperature relatively by including the conductor which transmits the heat.

The apparatuses and methods of the disclosure can be implemented in hardware, and in part as firmware or as machine executable computer code in conjunction with hardware that is stored on a non-transitory machine readable medium such as a CD ROM, a RAM, a floppy disk, a hard disk, or a magneto-optical disk, or computer code downloaded over a network originally stored on a remote recording medium or a non-transitory machine readable medium and stored on a local non-transitory recording medium for execution by hardware such as a processor, so that the methods described herein are loaded into hardware such as a general purpose computer, or a special processor or in programmable or dedicated hardware, such as an ASIC or FPGA. As would be understood in the art, the computer, the processor, microprocessor controller or the programmable hardware include memory components, e.g., RAM, ROM, Flash, etc., that may store or receive machine executable code or computer code that when accessed and executed by the computer, processor or hardware implement the processing methods described herein. In addition, it would be recognized that when a general purpose computer accesses code for implementing the processing shown herein, the execution of the code transforms the general purpose computer into a special purpose computer for executing the processing shown herein. In addition, an artisan understands and appreciates that a "processor", "microprocessor" "controller", or "control unit" constitute hardware in the claimed disclosure that contain circuitry that is configured for operation. Under the broadest reasonable interpretation, the appended claims constitute statutory subject matter in compliance with 35 U.S.C. § 101 and none of the elements are software per se.

The definition of the terms "unit" or "module" as referred to herein are to be understood as constituting hardware circuitry such as a CCD, CMOS, SoC, AISC, FPGA, a processor or microprocessor (a controller) configured for a certain desired functionality, or a communication module containing hardware such as transmitter, receiver or transceiver, or a non-transitory medium comprising machine executable code that is loaded into and executed by hardware for operation, in accordance with statutory subject matter under 35 U.S.C. § 101 and do not constitute software per se. In addition, the controllers shown herein are hardware that are comprised of components, for example, a processor or microprocessor configured for operation by the algorithms shown in the flowcharts and described herein.

While the present disclosure has been shown and described with reference to various embodiments thereof, it will be understood by those skilled in the art that various changes in form and details may be made therein without departing from the spirit and scope of the present disclosure as defined by the appended claims and their equivalents.

What is claimed is:

1. An electronic device comprising:
a display;
a printed circuit board (PCB);
a battery;
a back housing, wherein the back housing comprises an inner surface having a first region that is under the PCB and a second region that is under the battery;
an antenna located over the first region and the second region; and
a conductor configured to transmit heat from the first region that is under the PCB to the second region that is under the battery,
wherein the conductor and the antenna are disposed on a same surface of the electronic device, the conductor is adjacent to at least a part of the antenna, and operates as a part of the antenna; and
wherein the same surface on which the antenna and the conductor are disposed is the inner surface of the back housing.

2. The electronic device of claim 1, wherein the conductor is located over both a portion of the first region that is under the PCB and a portion of the second region that is under the battery.

3. The electronic device of claim 1, wherein the antenna has at least a partial pattern of a loop antenna.

4. The electronic device of claim 1, wherein the antenna transmits signals to, or receives signals from a near field communication (NFC) network.

5. The electronic device of claim 1, wherein the antenna and the conductor are formed on the inner surface of the back housing by a laser direct structuring (LDS) method.

6. The electronic device of claim 5, further comprising:
an LDS coating layer on which the antenna and the conductor are formed.

7. The electronic device of claim 5, further comprising:
a protective painting layer formed on the antenna and the conductor.

8. The electronic device of claim 5, further comprising:
a shielding sheet for suppressing eddy current, which is located on the antenna and the conductor.

9. The electronic device of claim 8, wherein the shielding sheet for suppressing eddy current comprises a ferrite sheet.

10. The electronic device of claim 5, wherein the antenna and the conductor are simultaneously formed in one process.

11. The electronic device of claim 1, wherein the antenna and the conductor are formed in a same layer within the electronic device.

12. The electronic device of claim 1, wherein the PCB and the battery are non-overlapping.

13. An electronic device comprising:
a display;
a rear housing:
a first region corresponding to a first part of the electronic device;
a second region corresponding to a second part of the electronic device which, during operation of the electronic device, has a lower temperature than that of the first region prior to a heat transfer therebetween, wherein the first region and the second region are between the display and the rear housing;
an antenna located over the first region and the second region; and
a conductor configured to transmit heat from the first region to the second region,
wherein the conductor and the antenna are formed on a same layer of the electronic device, the conductor is adjacent to at least a part of the antenna, and operates as a part of the antenna, wherein the antenna is a loop antenna having a plurality of windings, and the conductor occupies only a partial region within an inner winding of the windings, the partial region being a continuous region between a first portion of an inner loop perimeter to a second portion of the inner loop perimeter.

* * * * *